United States Patent
Salle et al.

(10) Patent No.: US 9,524,459 B2
(45) Date of Patent: Dec. 20, 2016

(54) CONTACT SMART CARD

(71) Applicant: Johnson Electric S.A., Murten (CH)

(72) Inventors: Vincent Daniel Jean Salle, Hong Kong (CN); Teck De Loi, Singapore (SG); Arthur Demaso, Shanghai (CN)

(73) Assignee: JOHNSON ELECTRIC S.A., Murten (CH)

( * ) Notice: Subject to any disclaimer, the term of this patent is extended or adjusted under 35 U.S.C. 154(b) by 0 days.

(21) Appl. No.: 14/975,187

(22) Filed: Dec. 18, 2015

(65) Prior Publication Data

US 2016/0104063 A1    Apr. 14, 2016

Related U.S. Application Data

(62) Division of application No. 14/249,722, filed on Apr. 10, 2014, now Pat. No. 9,251,457.

(30) Foreign Application Priority Data

Apr. 11, 2013 (CN) .......................... 2013 1 0125487

(51) Int. Cl.
*G06K 19/077* (2006.01)
*G06K 19/02* (2006.01)
(Continued)

(52) U.S. Cl.
CPC ....... *G06K 19/07743* (2013.01); *G06K 19/022* (2013.01); *G06K 19/07722* (2013.01); *H01L 23/49855* (2013.01); *H01L 24/81* (2013.01); *H01L 24/97* (2013.01); *H01L 24/11* (2013.01); *H01L 24/13* (2013.01); *H01L 24/16* (2013.01); *H01L 24/27* (2013.01); *H01L 24/29* (2013.01);
(Continued)

(58) Field of Classification Search
CPC .................. G06K 19/07743; G06K 19/07722; G06K 19/022; H01L 24/83; H01L 24/97; H01L 23/49855
See application file for complete search history.

(56) References Cited

U.S. PATENT DOCUMENTS 6,433,359 B1 * 8/2002 Kelley .................. B82Y 10/00
257/40
2007/0013396 A1 1/2007 Kim et al.
(Continued)

FOREIGN PATENT DOCUMENTS

| CN | 102395247 | 3/2012 |
|---|---|---|
| CN | 202871781 | 4/2013 |
| WO | WO00/64229 | 10/2000 |

*Primary Examiner* — Kristy A Haupt
(74) *Attorney, Agent, or Firm* — Muncy, Geissler, Olds & Lowe, P.C.

(57) ABSTRACT

A contact smart card has a smart card contact pad and an IC chip. The smart card contact pad includes a circuit substrate, a card-reader contact element on a first side of the circuit substrate, and a connection element on a second side of the circuit substrate. The card-reader contact element has a noble metal electrically conductive surface, and the connection element has a chip terminal connection surface which is not a noble metal. The IC chip is preferably flip-chip mounted at the second side of the circuit substrate and electrically connected to the chip terminal connection surface. Furthermore, the chip terminal connection surface is preferably an organometallic electrically conductive corrosion protection layer.

17 Claims, 4 Drawing Sheets

(51) Int. Cl.
*H01L 23/498* (2006.01)
*H01L 23/00* (2006.01)
*H05K 3/24* (2006.01)

(52) U.S. Cl.
CPC ............... *H01L 24/32* (2013.01); *H01L 24/83* (2013.01); *H01L 24/92* (2013.01); *H01L 24/95* (2013.01); *H01L 2224/0401* (2013.01); *H01L 2224/1134* (2013.01); *H01L 2224/1146* (2013.01); *H01L 2224/13019* (2013.01); *H01L 2224/16227* (2013.01); *H01L 2224/2731* (2013.01); *H01L 2224/2732* (2013.01); *H01L 2224/2919* (2013.01); *H01L 2224/32225* (2013.01); *H01L 2224/73204* (2013.01); *H01L 2224/8149* (2013.01); *H01L 2224/81191* (2013.01); *H01L 2224/81395* (2013.01); *H01L 2224/81455* (2013.01); *H01L 2224/81903* (2013.01); *H01L 2224/8385* (2013.01); *H01L 2224/83101* (2013.01); *H01L 2224/83192* (2013.01); *H01L 2224/83851* (2013.01); *H01L 2224/9211* (2013.01); *H01L 2224/95115* (2013.01); *H01L 2924/15313* (2013.01); *H05K 3/244* (2013.01)

(56) References Cited

U.S. PATENT DOCUMENTS

| | | | | |
|---|---|---|---|---|
| 2010/0159987 A1* | 6/2010 | Kim | .................... | G06K 7/0021 |
| | | | | 455/558 |
| 2012/0328904 A1* | 12/2012 | Baskin | .................. | C25D 7/123 |
| | | | | 428/686 |

* cited by examiner

CONTACT SMART CARD

CROSS REFERENCE TO RELATED APPLICATIONS

This application is a divisional of U.S. patent application Ser. No. 14/249,722, filed on Apr. 10, 2014, entitled "A CONTACT SMART CARD", which claims priority under 35 U.S.C. §119(a) from Patent Application No. 201310125487.1 filed in The People's Republic of China on Apr. 11, 2013, the contents of which are hereby incorporated by reference.

FIELD OF THE INVENTION

The present invention relates to a contact smart card having a smart card contact pad and an IC chip, a SIM card and/or bank card having such a contact smart card, a method of forming the smart card contact pad, a method of preventing or limiting oxidation of a non-noble metal flip-chip terminal connection layer of such a smart card contact pad, and to a smart card contact pad.

BACKGROUND OF THE INVENTION

A smart card contact pad is well known and is used in SIM cards for mobile telecommunications devices and bank cards, amongst other things. The known pad is layered with gold on both sides, being a card-reader contact side and a chip mounting side. Gold provides resistance to corrosion and oxidation, along with enabling wire-bonded connections between the chip mounting side and the IC chip being applied.

However, the use of a precious metal on both sides of the smart card contact pad increases manufacturing cost along with accelerating the depletion of a valuable natural resource.

The present invention therefore seeks to provide a solution to this problem.

SUMMARY OF THE INVENTION

Accordingly, in one aspect thereof, the present invention provides a contact smart card comprising a smart card contact pad and an IC chip, wherein the smart card contact pad comprises a circuit substrate, a card-reader contact element on a first side of the circuit substrate, and a chip connection element on a second side of the circuit substrate which is opposite the first side, the card-reader contact element having a noble metal electrically conductive surface, the chip connection element having a chip terminal connection surface which is not a noble metal, and the IC chip being mounted at the second side of the circuit substrate and electrically connected to the chip terminal connection surface.

Preferably, the circuit substrate is an imageable circuit substrate. The phrase 'imageable circuit substrate' used herein and throughout is intended to mean any suitable substrate which is capable or adapted to support or have thereon an electrical circuit applied by any of the various circuit application techniques using imaging technology, such as but not limited to printing. Therefore, by way of example, a printed or printable circuit substrate is well known, but other circuit imaging means are known, such as etching, electroplating, dry or wet imaging, and/or screened imaging. Equally, any suitable circuit substrate on which an electrical circuit can be provided can be utilized.

Preferably, the noble metal is or includes gold.

Preferably, at least one of the noble metal electrically conductive surface of the card-reader contact element and the chip terminal connection surface of the chip connection element is an electrodeposited layer.

Preferably, at least one corrosion protection layer which overlies at least one of the chip terminal connection surface and the noble metal electrically conductive surface.

Preferably, the corrosion protection layer is an organometallic electrically conductive layer.

Preferably, the corrosion protection layer is thiol-based.

Preferably, the corrosion protection layer is a self-assembled mono-layer.

Preferably, the IC chip is flip-chip mounted to the chip connection element.

Preferably, a plurality of electrically-conductive bumps interconnect the IC chip and the chip connection element.

Preferably, the bumps are pointed studs or plated pads.

Preferably, the bumps lie on a first layer of the chip connection element.

According to a second aspect, the present invention provides a SIM card comprising a carrier substrate and a contact smart card as described above carried, by the carrier substrate.

According to a third aspect, the present invention provides a bank card comprising a carrier substrate and a contact smart card as described above, carried by the carrier substrate.

According to a further aspect, the present invention provides a method of forming a smart card contact pad, comprising the steps of: a] feeding a flexible carrier strip through a roll-to-roll transfer system; b] applying at least a noble metal card-reader layer at a first side of the flexible carrier strip; and c] applying a non-noble metal chip terminal connection layer at a second side of the flexible carrier strip which is opposite the first side.

Preferably, the method includes a step d] which is subsequent to step b] of applying a corrosion protection layer over at least one of the chip terminal connection layer and the noble metal card-reader layer.

Preferably, the corrosion protection layer is an organometallic electrically-conductive layer.

According to a further aspect, the present invention provides a method of preventing or limiting oxidation of a non-noble metal chip terminal connection surface of a smart card contact pad, the method comprising the step of applying an organometallic electrically-conductive corrosion-protection layer to the whole of a non-noble metal chip terminal connection surface prior to mounting of an IC chip using flip-chip mounting means.

Preferably, the corrosion-protection layer is contiguously applied to the whole of the non-noble metal chip terminal connection surface to form an unbroken overlying barrier surface.

According to a further aspect, the present invention provides a smart card contact pad comprising a circuit substrate, an electrical circuit supported by the circuit substrate and having a card-reader contact element on a first side of the circuit substrate, and a chip connection element on a second side of the circuit substrate which is opposite the first side, the card-reader contact element having a noble metal electrically conductive surface, and the chip connection element having a chip terminal connection surface which is not a noble metal.

Preferably, the contact pad has a thiol-based organometallic electrically conductive self-assembled mono-layer applied to the chip connection element.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
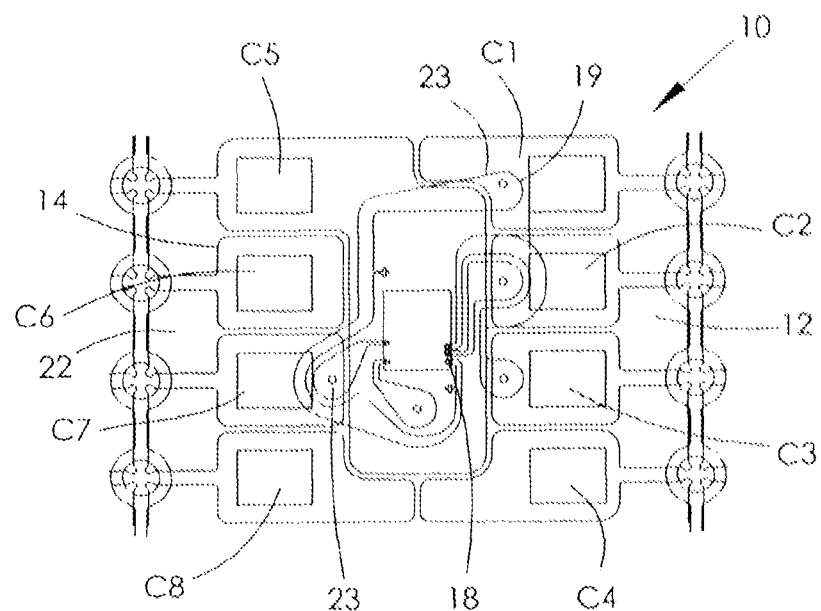
FIG. 1 shows a first embodiment of a smart card contact pad, in accordance with the present invention and formed using a flexible circuit substrate, a card-reader contact side and an opposing flip-chip mounting side both being shown for clarity purposes.
Figure 2:
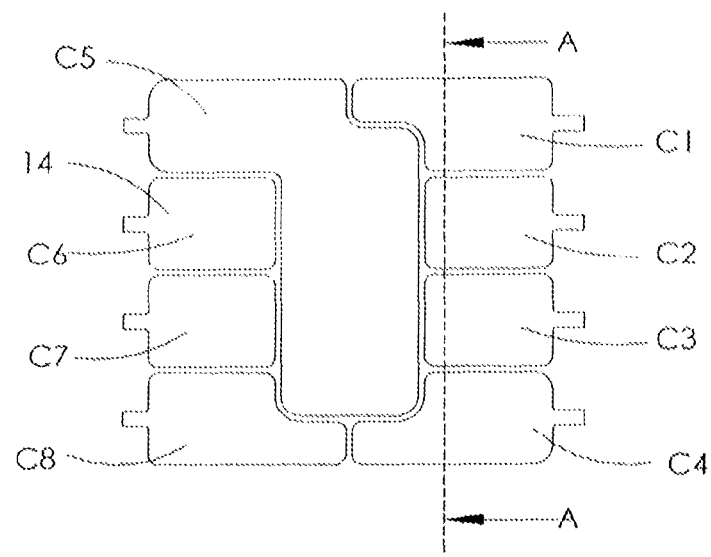
FIG. 2 shows the card-reader contact side of the smart card contact pad, as shown in FIG. 1.
Figure 3:
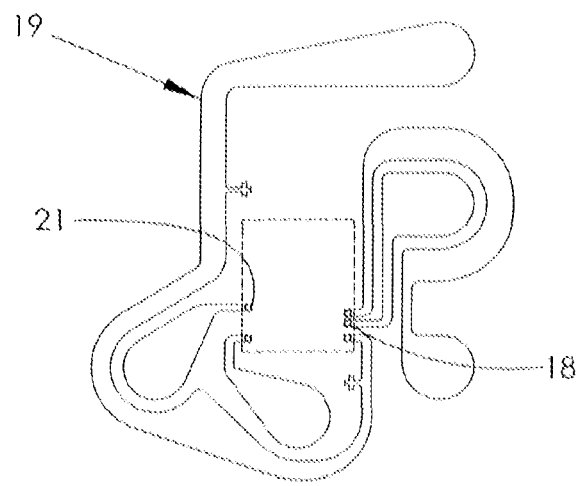
FIG. 3 shows the flip-chip mounting side of the smart card contact pad, shown in FIG. 1.
Figure 4:
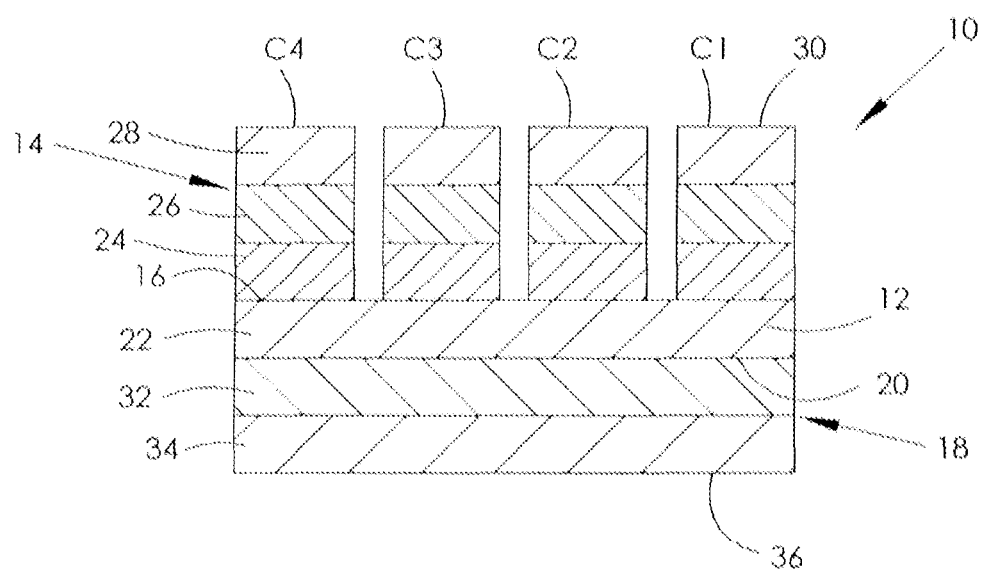
FIG. 4 is a diagrammatic cross-sectional view taken along line A-A in FIG. 2 of the smart card contact pad.

Referring firstly to FIGS. 1 to 4 of the drawings, there is shown a first embodiment of a smart card contact pad 10 which comprises a, preferably flexible and/or imageable, circuit substrate 12, which may be printed, printable or otherwise able to have an electronic circuit applied thereto or provided thereon, a card-reader contact element 14 on a card-reader contact side 16 of the circuit substrate 12, and a chip connection element, preferably a flip-chip connection element 18, on a chip mounting side 20 of the circuit substrate 12 and which is opposite to the card-reader contact side 16.

The circuit substrate 12 is preferably a flexible plastics carrier strip 22, for example, formed from PET, and may have thickness in a range of 55 microns to 95 microns, and more preferably a thickness which is or is substantially 75 microns. The flexible plastics carrier strip 22 may be light transmissible, and in this embodiment is transparent.

The circuit substrate 12 is imageable, that is, being capable of supporting or having thereon an electrical circuit image, either on the surface of or integrated with the body of the circuit substrate 12. In particular, the circuit substrate 12 is preferably a printed circuit film, but any other suitable means of creating a circuit image may be utilised, as explained above.

Although preferably flexible, a non-flexible circuit substrate may be utilized.

The card-reader contact element 14 comprises a plurality of electrically conductive overlying layers, applied preferably using electrodeposition. A substrate-side electrically conductive layer 24, in this case being or including copper, is applied to the card-reader contact side 16 of the circuit substrate. This substrate-side electrically conductive layer 24 is preferably in a range of 5 microns to 25 microns, and more preferably 10 microns or approximately 10 microns.

An intermediate electrically conductive layer 26, in this case being or including nickel, is then applied to overlie the substrate-side electrically conductive layer 24. The intermediate electrically conductive layer 26 is in contiguous uninterrupted contact with the substrate-side electrically conductive layer 24, and preferably has a thickness in a range of 1.0 micron to 4 microns, and more preferably 2.5 microns or approximately 2.5 microns.

An outer electrically conductive layer 28, in this case being or including gold, is then applied to overlie the intermediate electrically conductive layer 26, thus forming a card-reader contact surface 30. Again, this outer electrically conductive layer 28 is in contiguous uninterrupted contact with the intermediate electrically conductive layer 26, and preferably has a thickness in the range of 0.02 microns to 0.08 microns, and more preferably 0.045 microns or approximately 0.045 microns.

In this embodiment, the layers of the card-reader contact element 14 are all preferably metal, and additional intermediate layers may be utilised as required.

Contacts C1 to C8 are defined in the card-reader contact element 14, preferably by etching, and in this case a wet etching process may be conveniently utilized. Although eight contacts are provided, more or less than eight contacts may be utilised as necessity dictates.

In this embodiment, contacts C1 to C8 are as follows: the first contact C1, known as VCC, is utilized for power connection through which operating power is supplied to the microprocessor chip in the card; the second contact C2, known as RST, is utilized as a reset line through which an interface device can signal to a microprocessor chip of the smart card to initiate its reset sequence of instructions; the third contact C3, known as CLK, is the clock signal line through which a clock signal can be provided to the microprocessor chip, controlling the operation speed and providing a common framework for data communication between the interface device and an integrated circuit card; the fourth contact C4, known as RFU, is presently reserved for future use; the fifth contact C5, known as GND, is the ground line providing common electrical ground between the interface device and the integrated circuit card; the sixth contact C6, also known as VPP, provides a programming power connection used to program EEPROM of first generation integrated circuit cards; the seventh contact C7, also denoted as I/O, is an input/output line that provides a half-duplex communication channel between the reader and the smart card; and the eighth contact C8, is also an RFU, which is reserved for future use. Contacts 1 through 8 may be reconfigured to provide alternative functions or the functions may be interchanged as required.

The chip connection element 18 also comprises a plurality of electrically conductive overlying layers forming an electrically conductive trace 19 extending from an IC chip terminal or terminals 21 to a contact pad terminal or terminals 23 extending through the flexible plastics carrier strip 22 to respective contacts C1 to C8, and which again which may be conveniently applied utilizing electrodeposition. A further substrate-side electrically conductive layer 32, in this case being or including copper, is applied to the chip mounting side 20 of the substrate body 12. This further substrate-side electrically conductive layer 32 is again preferably in a range of 5 microns to 25 microns, and more preferably 10 microns or approximately 10 microns.

A further outer electrically conductive layer 34, in this case being or including nickel instead of being gold or a gold composition, is then applied to overlie the further substrate-side electrically conductive layer 32, thus forming a chip terminal connection surface 36. This further outer electrically conductive layer 34 is in contiguous uninterrupted contact with the further substrate-side electrically conductive layer 32, and may have a thickness in a range of 1 micron to 4 microns, and more preferably 2.5 microns or approximately 2.5 microns.

Although the card-reader contact surface 30 is or includes gold, due largely to its low reactivity with environmental agents and aesthetics, any suitable electrically-conductive noble metal, and preferably a precious metal such as platinum, can be considered for use. Similarly, nickel or a nickel composition is suggested for the chip terminal connection surface 36 to which the terminals of the IC chip are engaged. However, any suitable electrically-conductive non-noble metal being resistant to corrosion and oxidation may be utilized.

The terminals of an IC chip can thus be mounted to the chip terminal connection surface 36, preferably using a conventional flip-chip mounting procedure. The body of the IC chip is typically bonded to the substrate body 12. Although a flip-chip mounting technique or procedure is preferred, it is feasible that other mounting means may be considered and/or utilized.

Figure 5:
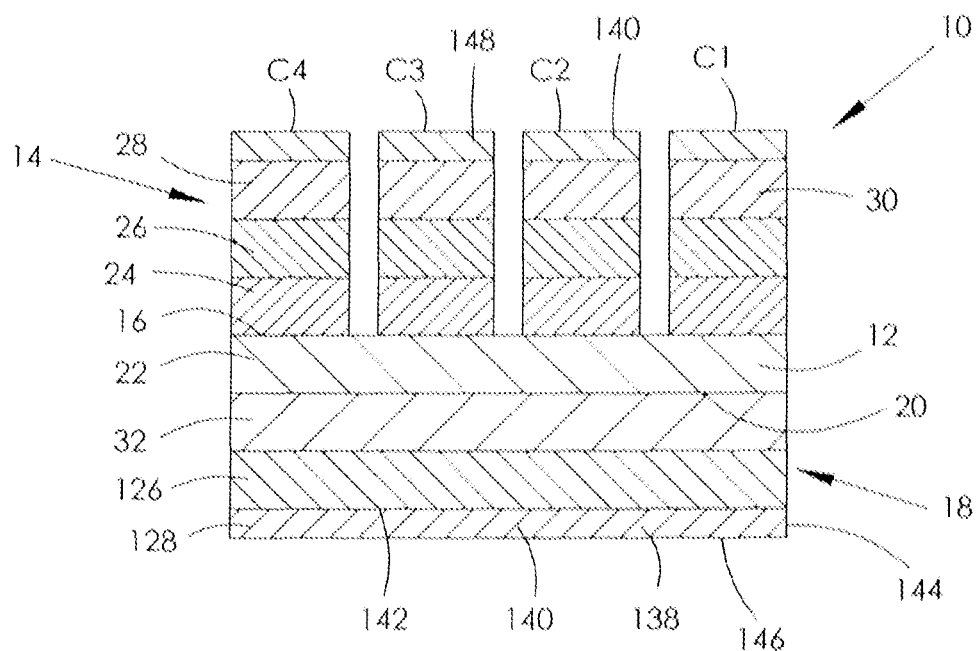
FIG. 5 is a diagrammatic cross-sectional view, similar to FIG. 4, of a second embodiment of a smart card contact pad, in accordance with the present invention.

Referring now to FIG. 5 of the drawings, there is shown a second embodiment of a smart card contact pad 10 which again comprises a, preferably flexible and/or imageable, circuit substrate 12, a card-reader contact element 14 on a card-reader contact side 16 of the circuit substrate 12, and a chip connection element 18 on a chip mounting side 20 of the circuit substrate 12 and which is opposite to the card-reader contact side 16. As such, the same references are used for parts which are similar or identical to those of the first embodiment, and further detailed description is omitted.

The chip connection element 18 includes the, preferably copper or copper composition, substrate-side electrically conductive layer 24. However, the, preferably nickel or nickel composition, electrically conductive layer now forms a further intermediate electrically conductive layer 126, and outer electrically conductive layer 128 is a corrosion-protection layer 138 which in this case is of an organometallic non-porous, preferably thiol-based, material 140 contiguously formed over a whole outwardly facing surface 142 of the further intermediate electrically conductive layer 126. Beneficially, the corrosion-protection layer 138 may form part of the chip connection element 18, or it may be considered to be separate and thus formed to overlie the chip connection element 18.

Conveniently, the corrosion-protection layer 138 may be a self-assembled mono-layer 144, whereby an unbroken overlying barrier surface 146 can thus be provided. Although preferably electrically conductive, the corrosion-protection layer may not be electrically conductive, as necessity requires.

The organic non-porous thiol-based material 140 is suggested due to it being electrically conductive, light transmissible, in this case preferably transparent, and anti-allergenic with human contact. Such a corrosion-protection layer 138 thus retains electrical conductivity with the further intermediate electrically conductive layer 126 which it overlies. Furthermore, the stoichiometry of this organometallic corrosion-protection layer 138 mitigates the formation of nickel oxides during the application of the self-assembled mono-layer 144. Creep corrosion is a known phenomenon causing premature failure of electrical components due to an increasingly sulphur-laden atmospheric environment, and the corrosion-protection layer 138 of the present invention forms a barrier against these deleterious effects. A suitable material for the corrosion-protection layer is now available from Parlex USA, Inc. of One Parlex Place, Methuen, Mass. 01844, USA under product code N019292.

However, other suitable electrically-conductive corrosion-protection materials may be considered, as required.

Although not necessarily essential, it is also beneficial to include a further corrosion-protection layer 148 which overlies the gold or gold composition electrically conductive layer 28 of the card-reader contact element 14. This is advantageous in that a thickness of the gold or gold composition electrically conductive layer 28 may then be reduced whilst maintaining the outwards aesthetic appearance. Again, it is advantageous to utilise such a further corrosion-protection layer 148 to reduce the exposure of the noble metal electrically conductive layer 28 to the corrosive effects of a sulfur containing environment. The further corrosion-protection layer 148 is, in this case, electrically conductive and thus has the same elements as described above with reference to the first said corrosion-protection layer. However, the further corrosion-protection layer may not necessarily be organometallic.

Additionally, the utilisation of a further corrosion-protection layer 148 reduces a galvanic nature of the card-reader contact element 14 due to the non-noble metals of the substrate-side and intermediate electrically conductive layers 24, 26 producing a galvanic cell with half-cell reactions.

Figure 6:
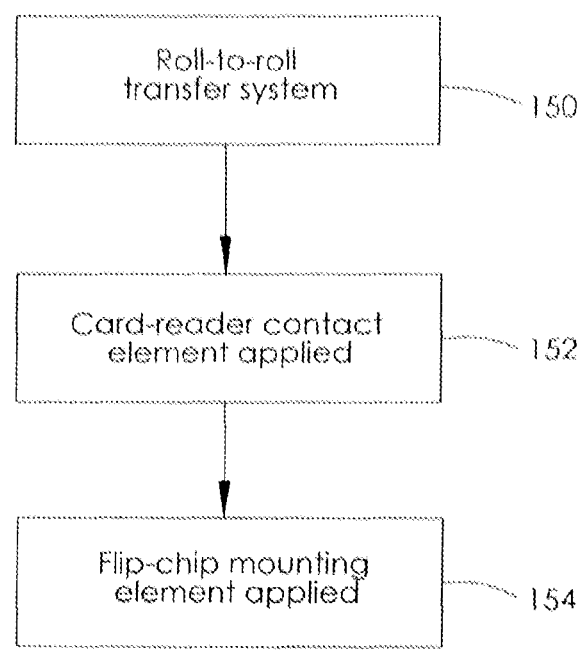
FIG. 6 shows a generalised diagrammatic flow diagram of a roll-to-roll manufacturing process of the smart card contact pad.

Referring to FIG. 6 of the drawings, it is advantageous to manufacture the smart card contact pad 10 as a plurality of smart card contact pads on the carrier strip 22 using roll-to-roll processing. The flexible carrier strip 22 is fed through a roll-to-roll transfer system 150, and the card-reader contact element 14 and the chip connection element 18 are applied using a staged process. It may be that one of the card-reader contact element 14 and the chip connection element 18 is applied first, see reference 152, with the other being applied thereafter, see reference 154. However, both the card-reader contact element 14 and the chip connection element 18 may be applied simultaneously during transfer of the carrier strip 22 through the roll-to-roll transfer system 150.

Once removed from the carrier strip 22, for example, by stamping, each smart card contact pad 10 can be individually mounted to a suitable carrier to form a required smart card, such as a telecommunications SIM card or bank card, for example.

Figure 7:
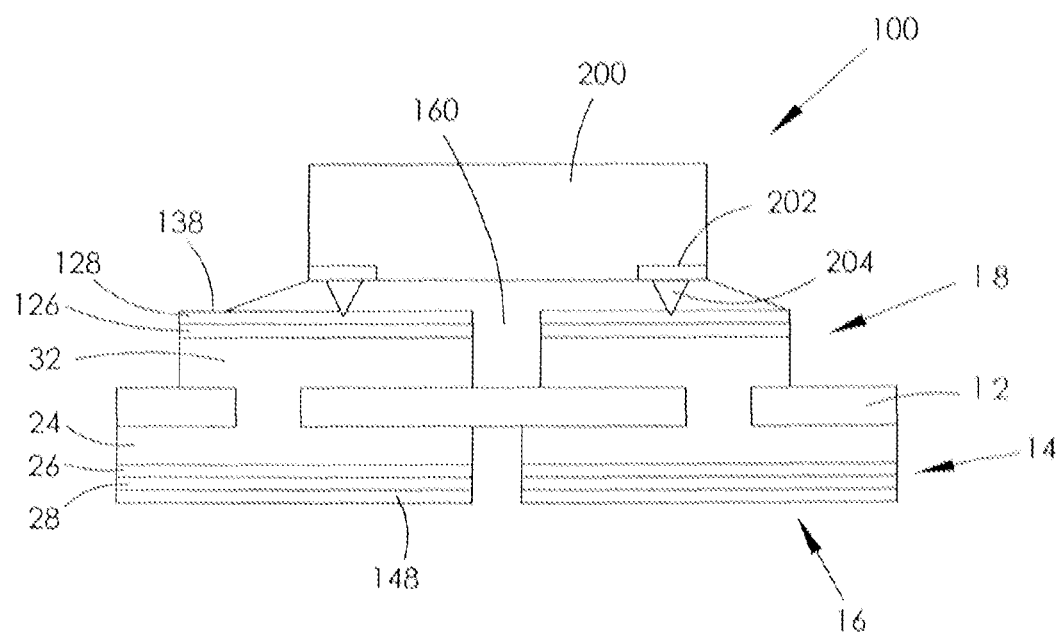
FIG. 7 is a diagrammatic cross-sectional view of the smart card contact pad described with reference to FIG. 5, in combination with a first IC chip.
Figure 8:
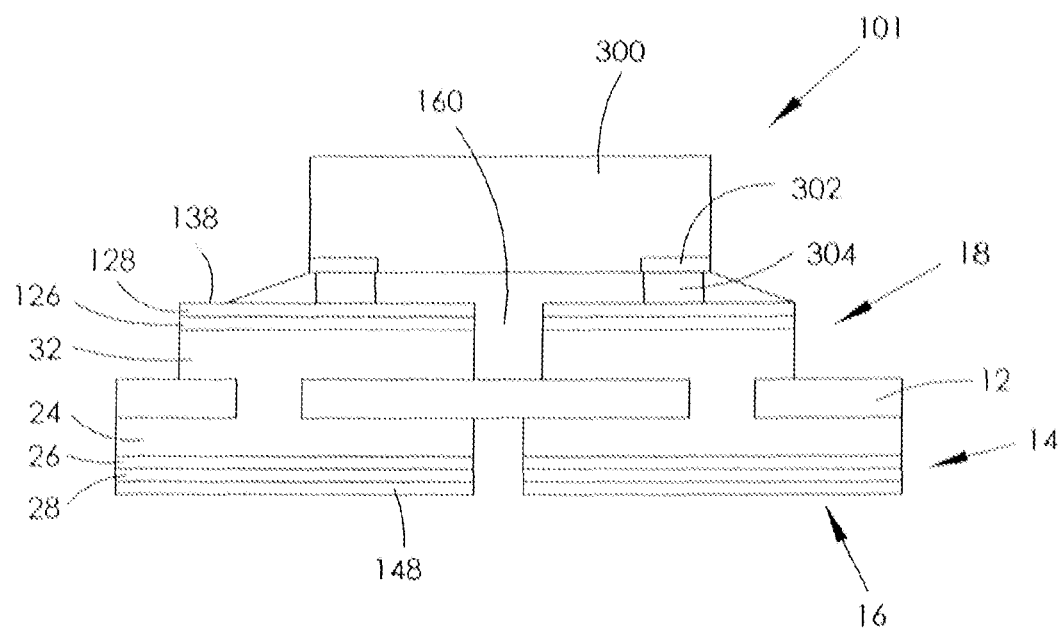
FIG. 8 is a diagrammatic cross-sectional view of the smart card contact pad described with reference to FIG. 5, but this time in combination with a second different IC chip.

In each of FIGS. 7 and 8, there is shown the second embodiment of the smart card contact pad, in combination with first and second examples of an associated IC chip, which in this case is flip-chip mounted using a flip-chip mounting technique.

The smart card contact pad shown in FIG. 7, referenced globally as 100, has a first flip-chip 200, which includes a plurality of chip pads 202, each of which is attached to an electrically-conductive stud bump 204. Stud bumps 204 are preferably pointed or sharp to make point contact with the chip contact element 18 to form an electrical connection therewith. To prevent or inhibit slippage, the flip-chip 200 is preferably fixed to the contact pad by an adhesive 160.

Preferably, the adhesive is in the form of a paste or film. The adhesive is preferably not electrically conductive for cost reasons. However, anisotropic (z-axis) conductive adhesive may be used even though it is more expensive. The adhesive holds the bumps in contact with the chip contact element.

Alternatively, the smart card contact pad shown in FIG. 8 could be utilised, referenced globally as 101. Attached is a second flip-chip 300, which also includes a plurality of chip pads 302, each of which is attached to an electrically-conductive plated bump or projection 304, in this case being slim line and having a lower profile than the stud bump 204 above. The plated bump 304 abuts or sits on the outer electrically conductive layer 128 of the chip contact element 18, thereby making a surface or area contact with the outermost layer, to electrically connect the chip to the chip contact element 18. Again, the flip-chip 300 is preferably adhered using an adhesive 160 to hold the plated bumps 304 in contact with the chip contact element.

In this embodiment, the card-reader contact side 16 preferably comprises four layers on top of the flexible circuit substrate body 12, namely the substrate-side electrically conductive layer 24, the non-noble metal intermediate electrically conductive layer 26, the noble metal outer electrically conductive layer 28 and the further corrosion-protection layer 148.

However, since the further corrosion-protection layer 148 is present in this embodiment, it may be possible to efficiently electrically connect the flip-chip 300 to the card-reader contact element 14 without necessarily providing the non-noble metal intermediate electrically conductive layer 26. Removal of the non-noble metal intermediate electrically conductive layer 26 will accordingly reduce the cost of the smart card contact pad 10.

It will be appreciated that if the flip-chip 200, 300 is mounted to the circuit substrate 12 at the time at which the contact pad 10 is formed, the mounting adhesive 160 could be used as a barrier to oxidation or corrosion of the further intermediate electrically conductive layer 126 in place of the corrosion protection layer 138, reducing the number of components required to form the contact smart card. If the mounting adhesive 160 is used for this purpose, the noble metal outer electrically conductive layer 28 may still require the separate further corrosion-protection layer 148.

Thus it is feasible that an adhesive or bonding agent used to apply the IC chip to the chip connection element may also be a suitable corrosion protection layer, providing it meets the requirements previously mentioned.

It is thus possible to provide a smart card contact pad having a reduced noble metal requirement. Furthermore, a utilized noble metal is only on a card-reader contact surface. It is also possible to provide a smart card contact pad having a non-noble metal chip terminal connection surface which is not or substantially not subject to corrosion or oxidation prior to the mounting of an IC chip.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and further modifications will be apparent to persons skilled in the field without departing from the scope of the invention as defined by the appended claims.

The invention claimed is:

1. A contact smart card comprising a smart card contact pad and an IC chip, wherein the smart card contact pad comprises:
   a circuit substrate,
   a card-reader contact element on a first side of the circuit substrate, and
   a chip connection element on a second side of the circuit substrate which is opposite the first side,
   the card-reader contact element having a noble metal electrically conductive surface, the chip connection element having a chip terminal connection surface which is not a noble metal, and the IC chip being mounted at the second side of the circuit substrate and electrically connected to the chip terminal connection surface;
   at least one organometallic electrically conductive corrosion protection layer which overlies at least one of the chip terminal connection surface and the noble metal electrically conductive surface.

2. The contact smart card of claim 1, wherein said noble metal is or includes gold.

3. The contact smart card of claim 1, wherein at least one of the noble metal electrically conductive surface of the card-reader contact element and the chip terminal connection surface of the chip connection element is an electrodeposited layer.

4. The contact smart card of claim 1, wherein the corrosion protection layer is thiol-based.

5. The contact smart card of claim 1, wherein the corrosion protection layer is a self-assembled mono-layer.

6. The contact smart card of claim 1, wherein the IC chip is flip-chip mounted to the chip connection element.

7. The contact smart card of claim 6, further comprising a plurality of electrically-conductive bumps which interconnect the IC chip and the chip connection element.

8. The contact smart card of claim 7, wherein the bumps are pointed studs or plated pads.

9. The contact smart card of claim 8, wherein the bumps lie on a first layer of the chip connection element.

10. A SIM card comprising a carrier substrate and the contact smart card of claim 1 carried by the carrier substrate.

11. A bank card comprising a carrier substrate and the contact smart card of claim 1 carried by the carrier substrate.

12. A method of forming a smart card contact pad, comprising the steps of:
   a] feeding a flexible carrier strip through a roll-to-roll transfer system;
   b] applying at least a noble metal card-reader layer at a first side of the flexible carrier strip;
   c] applying a non-noble metal chip terminal connection layer at a second side of the flexible carrier strip which is opposite the first side; and
   d] applying an organometallic electrically-conductive corrosion protection layer over at least one of the chip terminal connection layer and the noble metal card-reader layer.

13. A method of preventing or limiting oxidation of a non-noble metal chip terminal connection surface of a smart card contact pad, the method comprising the step of applying an organometallic electrically-conductive corrosion-protection layer to the whole of a non-noble metal chip terminal connection surface prior to mounting of an IC chip using a flip-chip mounting technique.

14. The method of claim 13, wherein the corrosion-protection layer is contiguously applied to the whole of the non-noble metal chip terminal connection surface to form an unbroken overlying barrier surface.

15. A smart card contact pad comprising:
a circuit substrate,
an electrical circuit supported by the circuit substrate and having a card-reader contact element on a first side of the circuit substrate, and
a chip connection element on a second side of the circuit substrate which is opposite the first side,
a thiol-based organometallic electrically conductive self-assembled mono-layer applied to the chip connection element,
the card-reader contact element having a noble metal electrically conductive surface, and the chip connection element having a chip terminal connection surface which is not a noble metal.

16. The contact smart card of claim 1, wherein the card-reader contact element has a plurality of metal conductive overlaying layers which are in contiguous uninterrupted contact and wherein the chip connection element has a plurality of metal conductive overlaying layers which are in contiguous uninterrupted contact.

17. The contact smart card of claim 15, wherein the card-reader contact element has a plurality of metal conductive overlaying layers which are in contiguous uninterrupted contact and wherein the chip connection element has a plurality of metal conductive overlaying layers which are in contiguous uninterrupted contact.

* * * * *